United States Patent
Park et al.

(10) Patent No.: US 11,963,422 B2
(45) Date of Patent: Apr. 16, 2024

(54) COLOR CONVERSION PANEL, METHOD OF MANUFACTURING THE SAME, AND DISPLAY DEVICE INCLUDING THE SAME

(71) Applicant: Samsung Display Co., Ltd., Yongin-si (KR)

(72) Inventors: Keunyoung Park, Suwon-si (KR); Hyunwoo Noh, Yongin-si (KR); Haeil Park, Seoul (KR); Moonjung Baek, Seoul (KR); Kwangkeun Lee, Osan-si (KR); Junhan Lee, Seoul (KR); Suji Han, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 330 days.

(21) Appl. No.: 17/325,023

(22) Filed: May 19, 2021

(65) Prior Publication Data

US 2022/0052120 A1 Feb. 17, 2022

(30) Foreign Application Priority Data

Aug. 12, 2020 (KR) .......................... 10-2020-0101207

(51) Int. Cl.
*H10K 59/38* (2023.01)
*G02B 5/00* (2006.01)
(Continued)

(52) U.S. Cl.
CPC ............ *H10K 59/38* (2023.02); *G02B 5/003* (2013.01); *G02B 5/201* (2013.01); *H10K 50/856* (2023.02);
(Continued)

(58) Field of Classification Search
None
See application file for complete search history.

(56) References Cited

U.S. PATENT DOCUMENTS 10,481,432 B2 11/2019 Cho et al.
2005/0253881 A1* 11/2005 Murayama ........... H10K 71/611
347/9
(Continued)

FOREIGN PATENT DOCUMENTS

JP 2015-220215 A 12/2015
KR 10-2018-0018945 A 2/2018
(Continued)

OTHER PUBLICATIONS

Extended European Search Report for corresponding EP Application No. 21190388.5, dated Jan. 20, 2022, 7pp.

*Primary Examiner* — Evren Seven
(74) *Attorney, Agent, or Firm* — Lewis Roca Rothgerber Christie LLP

(57) ABSTRACT

Disclosed is a color conversion panel which may include a first pixel area, a second pixel area, a third pixel area, and a non-pixel area positioned between the first pixel area, the second pixel area, and the third pixel area; a substrate; a light blocking layer in a non-pixel area on a substrate, a color filter layer including a first color filter, a second color filter, and a third color filter; a color conversion layer including a first color conversion pattern on the first color filter, a second color conversion pattern on the second color filter, and a light transmission pattern on third color filter; a transmission bank between the first color conversion pattern, the second color conversion pattern, and the light transmission pattern; an opening in the transmission bank; and a reflection bank in the opening of the transmission bank.

14 Claims, 12 Drawing Sheets

(51) Int. Cl.
*G02B 5/20* (2006.01)
*H10K 50/856* (2023.01)
*H10K 50/86* (2023.01)
*H10K 59/12* (2023.01)
*H10K 71/00* (2023.01)
*H10K 102/00* (2023.01)

(52) U.S. Cl.
CPC ........... *H10K 50/865* (2023.02); *H10K 59/12* (2023.02); *H10K 71/00* (2023.02); *H10K 2102/3026* (2023.02)

(56) References Cited

U.S. PATENT DOCUMENTS

| | | | |
|---|---|---|---|
| 2014/0160408 A1* | 6/2014 | Cho | G02F 1/133617 349/110 |
| 2014/0312339 A1* | 10/2014 | Fujita | H10K 59/35 257/40 |
| 2018/0059310 A1* | 3/2018 | Bae | G02F 1/136286 |
| 2019/0025634 A1* | 1/2019 | Park | G02F 1/133516 |
| 2020/0152705 A1 | 5/2020 | Son et al. | |
| 2021/0351238 A1 | 11/2021 | Park et al. | |

FOREIGN PATENT DOCUMENTS

| | | |
|---|---|---|
| KR | 10-2019-0010821 A | 1/2019 |
| WO | 2020/085606 A1 | 4/2020 |

\* cited by examiner

COLOR CONVERSION PANEL, METHOD OF MANUFACTURING THE SAME, AND DISPLAY DEVICE INCLUDING THE SAME

CROSS-REFERENCE TO RELATED APPLICATION

This patent application claims priority to and the benefit of Korean Patent Application No. 10-2020-0101207 filed on Aug. 12, 2020 in the Korean Intellectual Property Office (KIPO), the entire content of which is hereby incorporated by reference.

FIELD

Embodiments of the present disclosure relate to a display device, including, for example, embodiments which relate to a color conversion panel, a method of manufacturing a color conversion panel, and a display device including a display panel and a color conversion panel.

BACKGROUND

The market for display devices serving as connection media between users and information is growing as information technology further develops. Accordingly, the use of flat panel displays such as organic light emitting displays and liquid crystal displays is increasing.

Recently, display devices including a color conversion panel have been proposed to implement a display device having excellent color gamut and high luminance. The color conversion panel may include a bank to prevent or reduce color mixing between pixel areas. Meanwhile, a reflective layer may be disposed on a side of the bank to prevent or reduce the absorption of light by the bank. However, liquid repellency at an upper portion of the bank may decrease as the reflective layer is formed or the number of mask processes may be increased to form the reflective layer.

SUMMARY

Embodiments of the present disclosure provide a color conversion panel having improved light efficiency and a display device including the color conversion panel.

Embodiments provide a method of manufacturing a color conversion panel in which a manufacturing cost and a manufacturing time are reduced.

In a color conversion panel of present embodiments, there may be a first pixel area, a second pixel area, a third pixel area, and a non-pixel area positioned between the first to third pixel areas. The color conversion panel may include a substrate; a light blocking layer in the non-pixel area on the substrate; a color filter layer including a first color filter in the first pixel area on the substrate, a second color filter in the second pixel area on the substrate, and a third color filter in the third pixel area on the substrate; a color conversion layer including a first color conversion pattern on the first color filter, a second color conversion pattern on the second color filter, and a light transmission pattern on third color filter; a transmission bank between the first color conversion pattern, the second color conversion pattern, and the light transmission pattern, which may be on the light blocking layer; an opening in the transmission bank; and a reflection bank in the opening of the transmission bank.

In one embodiment, the transmission bank may have a transmittance of about 10% or more.

In one embodiment, the transmission bank may a first lyophilic portion, and a second liquid repellant portion portioned above the first lyophilic portion.

In one embodiment, the reflection bank may include metal having a reflectance of about 50% or more.

In one embodiment, the reflection bank may include at least one of aluminum (Al), silver (Ag), and gold (Au).

In one embodiment, the reflection bank may include scattering bodies.

In one embodiment, the reflection bank may include at least one of zinc oxide (ZnO), silicon oxide (SiO2), and titanium oxide (TiO2).

In one embodiment, the reflection bank may include an opening.

In one embodiment, the opening of the reflection bank may be empty.

In one embodiment, the color conversion panel may further include a filler in the opening of the reflection bank.

In one embodiment, the color conversion panel may further include a column spacer over the transmission bank and including a material equal to the filler.

In one embodiment, the color conversion panel may further include a protective layer on the color conversion layer extending between the transmission bank and the reflection bank.

A method of manufacturing a color conversion panel according to one embodiment may include forming a first color filter in a first pixel area, a second color filter in a second pixel area, a third color filter in a third pixel area, and a light blocking layer in a non-pixel area positioned between the first, second, and third pixel areas on a substrate; forming a transmission bank having an opening on the light blocking layer; forming a first color conversion pattern on the first color filter, a second color conversion pattern on the second color filter, and a light transmission pattern on the third color filter; forming a reflective layer extending into the opening of the transmission bank on the first color conversion pattern, the second color conversion pattern, and the light transmission pattern; and forming a reflection bank in the opening of the transmission bank by patterning the reflective layer.

In one embodiment, the reflective layer may be patterned by dry etching.

In one embodiment, the patterning of the reflective layer may include etching the reflective layer from a top surface of the reflective layer by a thickness of the reflective layer.

In one embodiment, the reflective layer may be patterned by wet etching.

In one embodiment, the patterning of the reflective layer may include forming a photoresist layer on the reflective layer, forming a filler overlapping the opening of the transmission bank and a column spacer positioned on the transmission bank by patterning the photoresist layer, and etching the reflective layer by using the filler and the column spacer as a mask.

In the method of manufacturing the color conversion panel according to present embodiments, the reflection bank in the opening of the transmission bank may be formed by patterning the reflective layer without an additional photolithography process, so that a manufacturing cost and a manufacturing time of the color conversion panel may be reduced.

A display device of present embodiments may include a display panel and a color conversion panel of present embodiments on the display panel, the display device having a first pixel area, a second pixel area, a third pixel area, and a non-pixel area positioned between the first, second, and third pixel areas. The color conversion panel may include a substrate; a light blocking layer in the non-pixel area on the substrate; a color filter layer including a first color filter in the first pixel area on the substrate, a second color filter in the second pixel area on the substrate, and a third color filter in the third pixel area on the substrate; a color conversion layer including a first color conversion pattern on the first color filter, a second color conversion pattern on the second color filter, and a light transmission pattern on the third color filter; a transmission bank between the first color conversion pattern, the second color conversion pattern, and the light transmission pattern on the light blocking layer; an opening in the transmission bank; and a reflection bank in the opening of the transmission bank.

In one embodiment, the display panel may include a light emitting device in each of the first pixel area, the second pixel area, and the third pixel area.

In another embodiment, the display device may further include a filling layer between the display panel and the color conversion panel.

In the color conversion panels and the display devices of present embodiments, the reflection bank may be in the opening of the transmission bank, so that the light efficiency of the display devices may be improved.

BRIEF DESCRIPTION OF THE DRAWINGS

The accompanying drawings are included to provide a further understanding of the subject matter of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Hereinafter, color conversion panels, methods of manufacturing the color conversion panels, and display devices in accordance with embodiments of the present disclosure will be explained in more detail with reference to the accompanying drawings.

Figure 1:
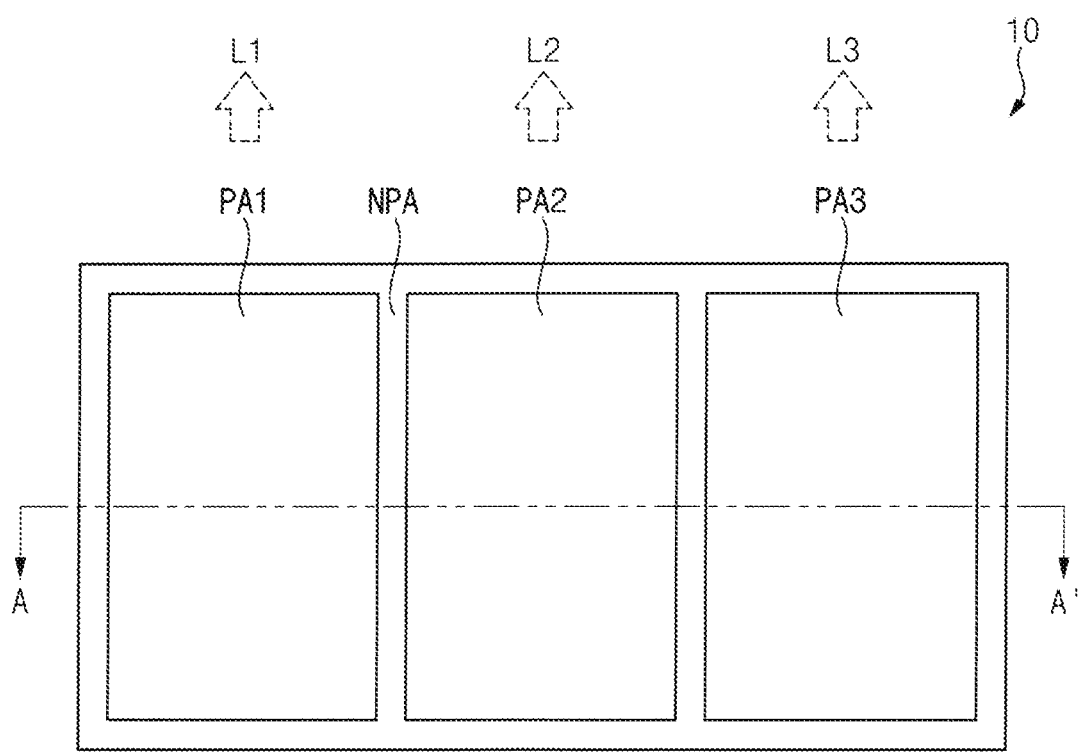
FIG. 1 is a plan view of a display device according to embodiments of the present disclosure.

FIG. 1 is a plan view illustrating the display device according to embodiments of the present disclosure.

Referring to FIG. 1, a display device 10 according to embodiments of the present disclosure may include a first pixel area PA1, a second pixel area PA2, a third pixel area PA3, and a non-pixel area NPA.

The first pixel area PA1 may emit a first light L1 of a first color; the second pixel area PA2 may emit a second light L2 of a second color; and the third pixel area PA3 may emit a third light L3 of a third color. In one or more embodiments, the first color may be red, the second color may be green, and the third color may be blue. The first pixel area PA1 may be a red pixel area, the second pixel area PA2 may be a green pixel area, and the third pixel area PA3 may be a blue pixel area.

The first pixel area PA1, the second pixel area PA2, and the third pixel area PA3 in combination may form one complete pixel area. The pixel area may emit a light in which the first light L1, second light L2, and third light L3 are mixed.

The non-pixel area NPA may be positioned between the first pixel area PA1, the second pixel area PA2, and the third pixel area PA3. For example, the non-pixel area NPA may surround the first pixel area PA1, the second pixel area PA2, and the third pixel area PA3 when viewed in a plan view. The non-pixel area NPA may not emit light.

Figure 2:
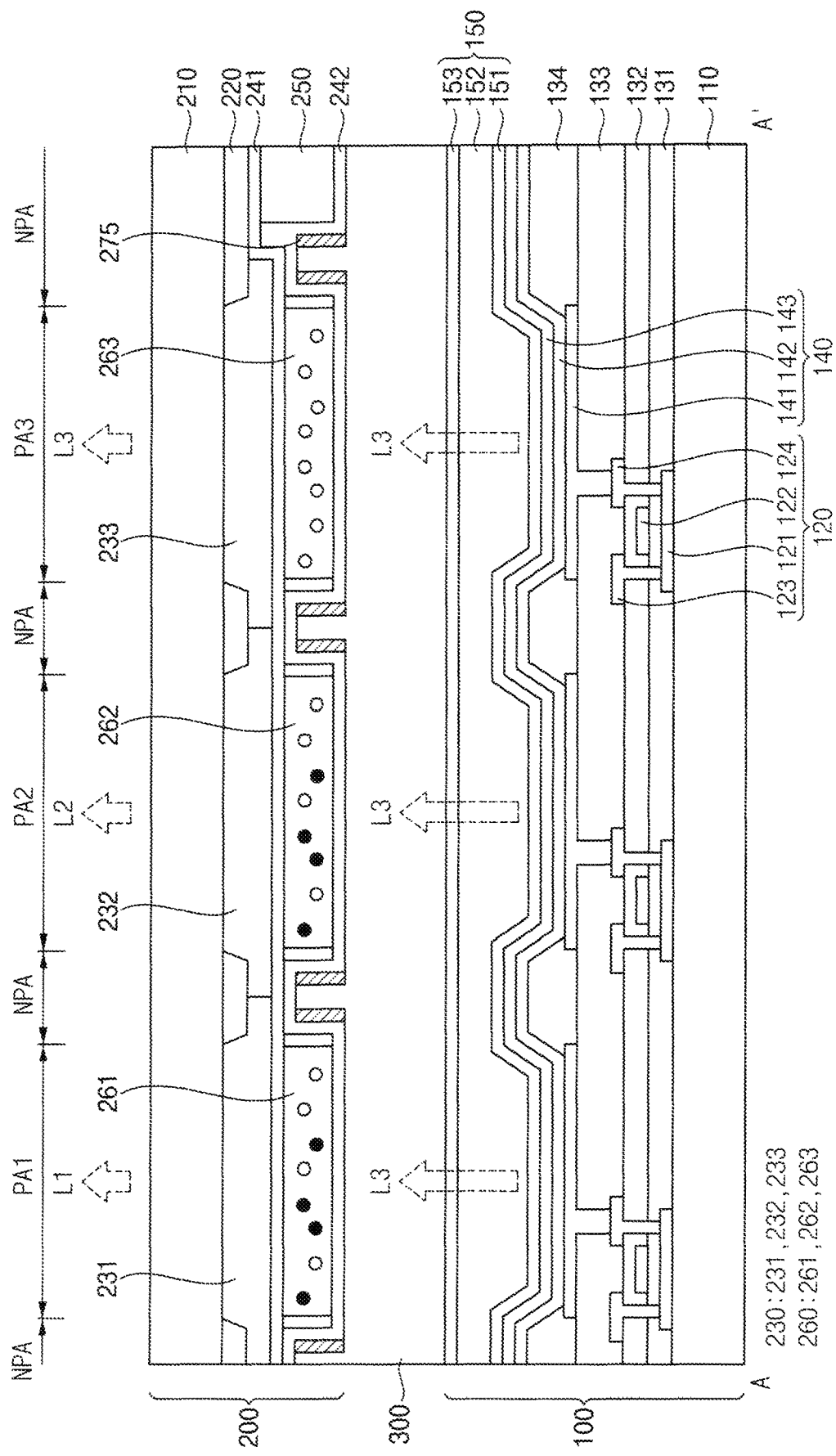
FIG. 2 is a cross-sectional view taken along the line A-A' of FIG. 1.

FIG. 2 is a cross-sectional view taken along line A-A' of FIG. 1.

Referring to FIG. 2, the display device 10 may include a display panel 100, a color conversion panel 200, and a filling layer 300.

The display panel 100 may provide light having one color to the color conversion panel 200. In one embodiment, the display panel 100 may provide the third light L3 to the color conversion panel 200. The display panel 100 may include a first substrate 110, a transistor 120, a light emitting device 140, and a thin film encapsulation layer 150.

The first substrate 110 may be a transparent or opaque insulating substrate. In one embodiment, the first substrate 110 may include glass, quartz, and/or other similar materials. In another embodiment, the first substrate 110 may include an organic insulating material such as polyimide, polycarbonate, polyethylene terephthalate, and/or polyacrylate.

An active pattern 121 may be on the first substrate 110. In one embodiment, the active pattern 121 may include amorphous silicon, polycrystalline silicon, and/or other similar materials. In another embodiment, the active pattern 121 may include an oxide semiconductor.

A gate insulating layer 131 may be on the first substrate 110, and cover the active pattern 121. The gate insulating layer 131 may include an inorganic insulating material such as silicon oxide, silicon nitride, and/or silicon oxynitride.

The gate electrode 122 may be on the gate insulating layer 131, and overlap the active pattern 121. The gate electrode 122 may include a conductive material such as copper (Cu), molybdenum (Mo), titanium (Ti), and/or aluminum (Al).

The interlayer insulating layer 132 may be on the gate insulating layer 131, and cover the gate electrode 122. The interlayer insulating layer 132 may include an inorganic insulating material such as silicon oxide, silicon nitride, and/or silicon oxynitride.

A source electrode 123 and a drain electrode 124 may be on the interlayer insulating layer 132, and connected to the active pattern 121. The source electrode 123 and the drain electrode 124 may include a conductive material such as copper (Cu), molybdenum (Mo), titanium (Ti), and/or aluminum (Al).

The active pattern 121, the gate electrode 122, the source electrode 123, and the drain electrode 124 may form the transistor 120. The transistor 120 may be in each of the first pixel area PA1, the second pixel area PA2, and the third pixel area PA3.

A planarization layer 133 may be on the interlayer insulating layer 132, and cover the source electrode 123 and the drain electrode 124. The planarization layer 133 may include an inorganic insulating material such as silicon oxide, silicon nitride, and/or silicon oxynitride, and/or; an organic insulating material such as acryl-based resin, epoxy-based resin, phenol-based resin, polyamide-based resin, polyimide-based resin, unsaturated polyester-based resin, polyphenylene-based resin, polyphenylene-based sulfide resin, and/or benzocyclobutene.

A pixel electrode 141 may be on the planarization layer 133, and connected to the drain electrode 124. The pixel electrode 141 may include a transparent conductive layer including indium-tin-oxide (ITO), indium-zinc-oxide (IZO), zinc oxide (ZnO), indium oxide (In2O3), and/or the like; and and/or a reflective conductive layer including silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), and/or the like. In one embodiment, the pixel electrode 141 may have a laminated structure of ITO, Ag, and ITO. The pixel electrode 141 may be a reflective electrode.

A pixel defining layer 134 may be on the planarization layer 133, and cover at least a part of the pixel electrode 141. In one embodiment, the pixel defining layer 134 may cover a periphery of the pixel electrode 141, and have a pixel opening exposing a central portion of the pixel electrode 141. The pixel defining layer 134 may include an inorganic insulating material such as silicon oxide, silicon nitride, and/or silicon oxynitride; and/or an organic insulating material such as acryl-based resin, epoxy-based resin, phenol-based resin, polyamide-based resin, polyimide-based resin, unsaturated polyester-based resin, polyphenylene-based resin, polyphenylene-based sulfide resin, and/or benzocyclobutene.

A light emitting layer 142 may be on the pixel electrode 141 and the pixel defining layer 134 exposed by the pixel opening. Holes provided from the pixel electrode 141 and electrons provided from a counter electrode 143 may be combined in the light emitting layer 142 to form excitons, and the light emitting layer 142 may emit light while the excitons are converted from (e.g., transition from) an excited state to a ground state. In one embodiment, the light emitting layer 142 may emit the third light L3.

A counter electrode 143 may be on the light emitting layer 142. The counter electrode 143 may include a transparent conductive layer including lithium (Li), calcium (Ca), aluminum (Al), magnesium (Mg), silver (Ag), platinum (Pt), lead (Pb), nickel (Ni), gold (Au), neodymium (Nd), iridium (Ir), chromium (Cr), barium (Ba), and/or the like. The counter electrode 143 may be a transmission electrode.

The pixel electrode 141, the light emitting layer 142, and the counter electrode 143 may form the light emitting device 140. The light emitting device 140 may be in each of the first pixel area PA1, the second pixel area PA2, and the third pixel area PA3.

The thin film encapsulation layer 150 may be on the counter electrode 143. The thin film encapsulation layer 150 may prevent or reduce permeation of impurities, moisture, and the like to the light emitting element 140 from the outside. The thin film encapsulation layer 150 may include at least one inorganic encapsulation layer and at least one organic encapsulation layer. In one embodiment, the thin film encapsulation layer 150 may include: a first inorganic encapsulation layer 151; a second inorganic encapsulation layer 153 on the first inorganic encapsulation layer 151; and an organic encapsulation layer 152 in between the first inorganic encapsulation layer 151 and the second inorganic encapsulation layer 153.

The color conversion panel 200 may be on the display panel 100. The color conversion panel 200 may convert light having one color provided from the display panel 100 into light having another color, or transmit the light. In one embodiment, the color conversion panel 200 may convert the third light L3 provided from the display panel 100 into the first light L1 or second light L2, or transmit the third light L3. The color conversion panel 200 may include a second substrate 210, a light blocking layer 220, a color filter layer 230, a first protective layer 241, a transmission bank 250, a color conversion layer 260, a second protective layer 242, a reflection bank 275, and the like. The color conversion panel 200 will be described in more detail below with reference to FIG. 3.

The filling layer 300 may be in between the display panel 100 and the color conversion panel 200. The filling layer 300 may be in between the thin film encapsulation layer 150 of the display panel 100 and the second protective layer 242 of the color conversion panel 200. The filling layer 300 may serve as a buffer so that the display panel 100 and the color conversion panel 200 are stably adhered to each other. The filling layer 300 may transmit light provided from the display panel 100. The filling layer 300 may include an organic material such as a silicone-based organic material, an epoxy-based organic material, and/or an epoxy-acryl-based organic material. For example, the filling layer 300 may include silicon rubber.

Figure 3:
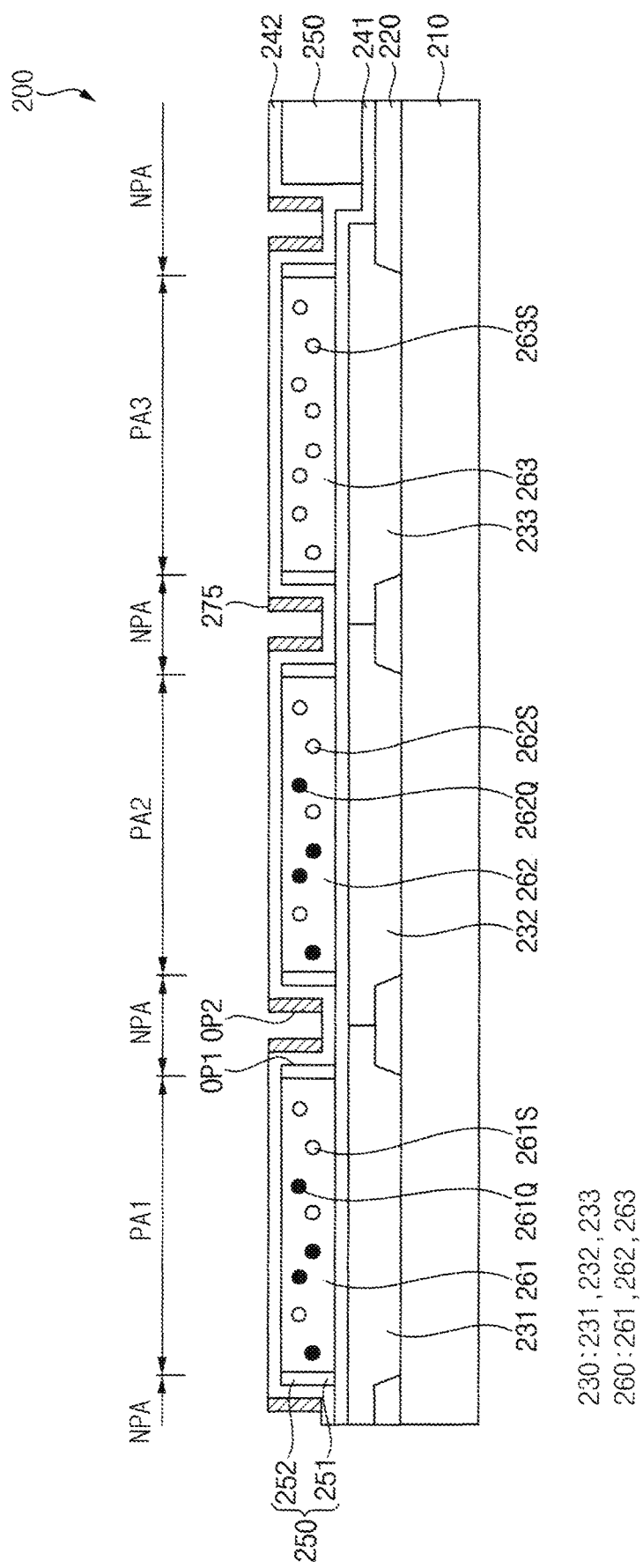
FIG. 3 is a cross-sectional view of a color conversion panel according to embodiments of the present disclosure.

FIG. 3 is a cross-sectional view of a color conversion panel of according to embodiments of the present disclosure. For example, FIG. 3 may represent a color conversion panel 200 of the display device 10 of FIG. 2.

Referring to FIGS. 2 and 3, the color conversion panel 200 according to one embodiment may include a second substrate 210, a light blocking layer 220, a color filter layer 230, a first protective layer 241, a transmission bank 250, a color conversion layer 260, a second protective layer 242, and a reflection bank 275.

The second substrate 210 may be a transparent insulating substrate. In one embodiment, the second substrate 210 may include glass, quartz, and/or other similar materials. In another embodiment, the second substrate 210 may include an organic insulating material such as polyimide, polycarbonate, polyethylene terephthalate, and/or polyacrylate.

The light blocking layer 220 may be on the second substrate 210. The light blocking layer 220 may be in the non-pixel area NPA. The light blocking layer 220 may block light incident to the light blocking layer 220 (or may reduce an amount of light incident to the light blocking layer 220). Accordingly, the light blocking layer 220 may prevent or reduce color mixing between respective light of the first pixel area PA1, the second pixel area PA2, and the third pixel area PA3.

The color filter layer 230 may be on the second substrate 210. The color filter layer 230 may include a first color filter 231, a second color filter 232, and a third color filter 233. The first color filter 231 may be in the first pixel area PA1, the second color filter 232 may be in the second pixel area PA2, and the third color filter 233 may be in the third pixel area PA3. The light blocking layer 220 may be in between the first color filter 231, the second color filter 232, and the third color filter 233.

The color filter layer 230 may transmit light having some wavelength band (e.g., having a set wavelength band) and incident to the color filter layer 230, and block or reduce an intensity of light having other wavelength bands and incident to the color filter layer 230. The first color filter 231 may transmit the first light L1 and block or reduce an intensity of, for example, the second light L2 and the third light L3. The second color filter 232 may transmit the second light L2 and block or reduce an intensity of, for example, the first light L1 and the third light L3. The third color filter 233 may transmit the third light L3 and block an intensity of, for example, the first light L1 and the second light L2.

In one embodiment, the light blocking layer 220 may include the same material as the third color filter 233. At this point, a specular reflection at an interface between the second substrate 210 and the light blocking layer 220 may be reduced, and accordingly, a reflection of external light from the display device 10 including the color conversion panel 200 may be reduced.

The first protective layer 241 may be on the color filter layer 230. The first protective layer 241 may prevent or reduce penetration of impurities such as moisture and air to the color filter layer 230 and the color conversion layer 260 from the outside. The first protective layer 241 may include an inorganic insulating material such as silicon oxide, silicon nitride, and/or silicon oxynitride.

The color conversion layer 260 may be on the first protective layer 241. The color conversion layer 260 may include a first color conversion pattern 261, a second color conversion pattern 262, and a light transmission pattern 263. The first color conversion pattern 261 may be on the first color filter 231, the second color conversion pattern 262 may be on the second color filter 232, and the light transmission pattern 263 may be on the third color filter 233. In other words, the first color conversion pattern 261 may be in the first pixel area PA1, the second color conversion pattern 262 may be in the second pixel area PA2, and the light transmission pattern 263 may be in the third pixel area PA3.

The first color conversion pattern 261 may convert light incident to the first color conversion pattern 261 into first light L1. In one embodiment, the first color conversion pattern 261 may convert the third light L3 into the first light L1. The first color conversion pattern 261 may include a red phosphor. The red phosphor may include at least one selected from (Ca, Sr, Ba)S, (Ca, Sr, Ba)2Si5N8, (CaAlSiN3), CaMoO4, and Eu2Si5N8. In addition, the first color conversion pattern 261 may include quantum dots 261Q. The quantum dots 261Q may convert the third light L3 into the first light L1. The first color conversion pattern 261 may further include scattering bodies 261S. The scattering bodies 261S may scatter light, which is incident to the first color conversion pattern 261, in various directions. The scattering bodies 261S may be metal oxide particles and/or organic particles. The metal oxide particles may include titanium oxide (TiO2), zirconium oxide (ZrO2), aluminum oxide (Al2O3), indium oxide (In2O3), zinc oxide (ZnO), tin oxide (SnO2), and/or the like, and the organic particles may include acryl-based resin, urethane-based resin, and/or the like.

The second color conversion pattern 262 may convert light incident to the second color conversion pattern 262 into the second light L2. In one embodiment, the second color conversion pattern 262 may convert the third light L3 into the second light L2. The second color conversion pattern 262 may include a green phosphor. The green phosphor may include at least one selected from yttrium aluminum garnet (YAG), (Ca, Sr, Ba)2SiO4, SrGa2S4, barium magnesium alum inate (BAM), alpha sialon (α-SiAlON), beta sialon (βp-SiAlON), Ca3Sc2Si3O12, Tb3Al5O12, BaSiO4, CaAl-SiON, and (Sr1-xBax)Si2O2N2. The x of (Sri-xBax)Si2O2N2 may be any number between 0 and 1. In addition, the second color conversion pattern 262 may include quantum dots 262Q. The quantum dots 262Q may convert the third light L3 into the second light L2. The second color conversion pattern 262 may further include scattering bodies 262S. The scattering bodies 262S may scatter light, which is incident to the second color conversion pattern 262, in various directions. The scattering bodies 262S included in the second color conversion pattern 262 may be substantially the same as the scattering bodies 261S included in the first color conversion pattern 261.

The light transmission pattern 263 may convert light incident to the light transmission pattern 263 into the third light L3. In one embodiment, the light transmission pattern 263 may transmit the third light L3. The light transmission pattern 263 may include a transparent polymer material. In addition, the light transmission pattern 263 may include scattering bodies 263S. The scattering bodies 263S may scatter light, which is incident to the light transmission pattern 263, in various directions. The scattering bodies 263S included in the light transmission pattern 263 may be substantially the same as the scattering bodies 261S included in the first color conversion pattern 261, and the scattering bodies 262S included in the second color conversion pattern 262.

The transmission bank 250 may be on the first protective layer 241. The transmission bank 250 may be in the non-pixel area NPA. The transmission bank 250 may be in between the first color conversion pattern 261, the second color conversion pattern 262, and the light transmission pattern 263 on the light blocking layer 220. In some embodiments, the transmission bank 250 may include a photoresist layer.

The transmission bank 250 may transmit light incident to the transmission bank 250. In some embodiments, the transmission bank 250 may have a transmittance of about 10% or more.

The transmission bank 250 may include a first portion 251, and a second portion 252 positioned above the first portion 251. For example, the first portion 251 may come into contact (e.g., physical contact) with the first protective layer 241, and the second portion 252 may be spaced apart from the first protective layer 241 with the first portion 251 interposed therebetween.

The first portion 251 may be lyophilic with respect to the first color conversion pattern 261, the second color conversion pattern 262, and the light transmission pattern 263. The second portion 252 may have liquid repellency with respect to the first color conversion pattern 261, the second color conversion pattern 262, and the light transmission pattern 263. Accordingly, in the process of forming the color conversion layer 260, the first color conversion pattern 261, the second color conversion pattern 262, and the light transmission pattern 263 may be in the first pixel area PA1, the second pixel area PA2, and the third pixel area PA3, respectively, and may not be in the non-pixel area NPA.

The transmission bank 250 may include a first opening OP1. In one or more embodiments, the first opening OP1 may have a shape of a through-hole formed in the transmission bank 250 and exposing the non-pixel area NPA of the first protective layer 241.

The second protective layer 242 may be on the color conversion layer 260 and the transmission bank 250. In some embodiments, the second protective layer 242 may extend into the first opening OP1 of the transmission bank 250. The second protective layer 242 may prevent or reduce the penetration of impurities such as moisture and/or air to the color filter layer 230 and the color conversion layer 260 from the outside. The second protective layer 242 may include an inorganic insulating material such as silicon oxide, silicon nitride, and/or silicon oxynitride.

The reflection bank 275 may be in the first opening OP1 of the transmission bank 250. In one embodiment, the reflection bank 275 may be in the non-pixel area NPA on the second protective layer 242. The second protective layer 242 may extend between the transmission bank 250 and the reflection bank 275.

The reflection bank 275 may reflect light incident to the reflection bank 275. For example, the reflection bank 275 may reflect light, which is converted or transmitted by the color conversion layer 260, toward the second substrate 210. Accordingly, the reflection bank 275 may prevent or reduce color mixing between respective light of the first pixel area PA1, the second pixel area PA2, and the third pixel area PA3, and may increase the light efficiency of the color conversion layer 260.

In some embodiments, the reflection bank 275 may include a metal having a reflectance of about 50% or more. For example, the reflection bank 275 may include aluminum (Al), silver (Ag), and/or gold (Au) as the metal. The light converted or transmitted by the color conversion layer 260 may be specularly reflected by the reflection bank 275.

In one or more embodiments, the reflection bank 275 may include scattering bodies. For example, the reflection bank 275 may include zinc oxide (ZnO), silicon oxide (SiO2), and/or titanium oxide (TiO2) as the scattering bodies. The light converted or transmitted by the color conversion layer 260 may be scattered and reflected by the reflection bank 275.

The reflection bank 275 may include a second opening OP2. In some embodiments, the second opening OP2 may have a shape of a through-hole formed in the reflection bank 275 and exposing the non-pixel area NPA of the second protective layer 242.

In one or more embodiments, the second opening OP2 of the reflection bank 275 may be empty. The filling layer 300 may fill the second opening OP2 of the reflection bank 275 in the process of bonding the display panel 100 to the color conversion panel 200, with the filling layer 300 in between.

FIGS. 4 to 8 are cross-sectional views showing manufacturing methods for the color conversion panels according to embodiments of the present disclosure. For example, FIGS. 4 to 8 may show a method of manufacturing the color conversion panel 200 of FIG. 3.

Figure 4:
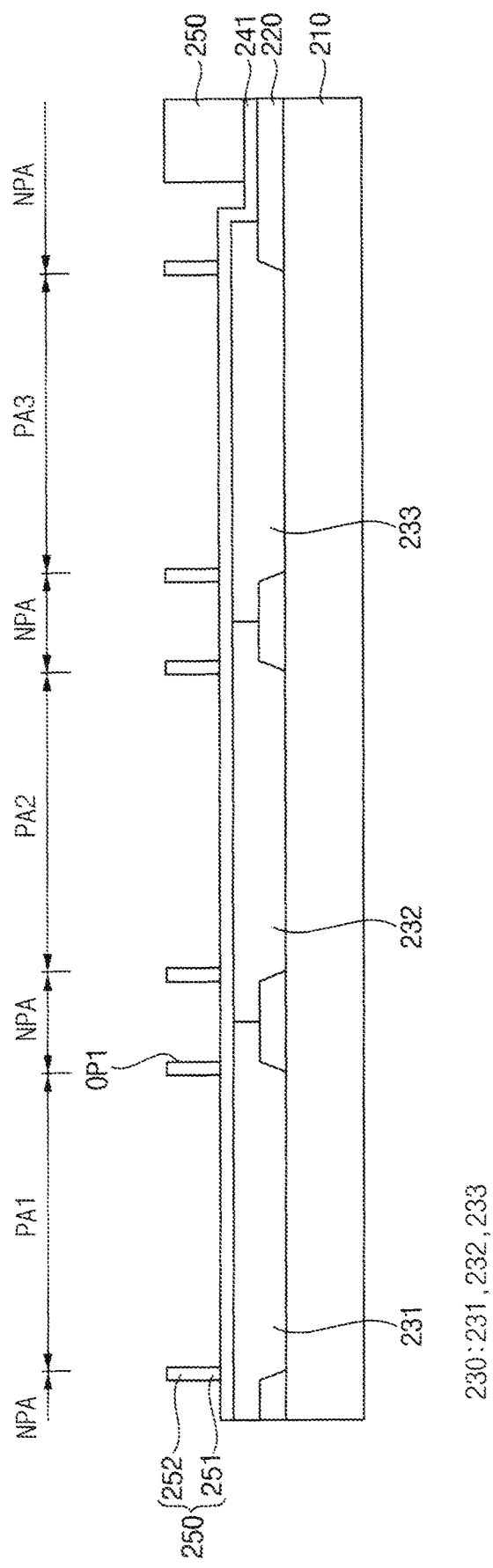
FIGS. 4 to 8 are cross-sectional views illustrating a method of manufacturing the color conversion panel according to embodiments of the present disclosure.

Referring to FIG. 4, the light blocking layer 220 may be formed in the non-pixel area NPA on the second substrate 210. The first color filter 231, the second color filter 232, and the third color filter 233 may be formed in the first pixel area PA1, the second pixel area PA2, and the third pixel area PA3 on the second substrate 210, respectively. Then, the first protective layer 241 may be formed on the light blocking layer 220, the first color filter 231, the second color filter 232, and the third color filter 233.

Then, the transmission bank 250 may be formed on the light blocking layer 220. In one or more embodiments, the transmission bank 250, including the first opening OP1, may be formed on the light blocking layer 220 by forming a photoresist layer on the first protective layer 241 and patterning the photoresist layer.

As fluorine groups in the transmission bank 250 move upward, portions where the fluorine groups are positioned may be liquid repellant in the process of forming the transparent bank 250. Accordingly, the transmission bank 250 may include a first portion 251 which is lyophilic, and a second portion 252 portioned above the first portion 251 and which is liquid repellent.

Figure 5:
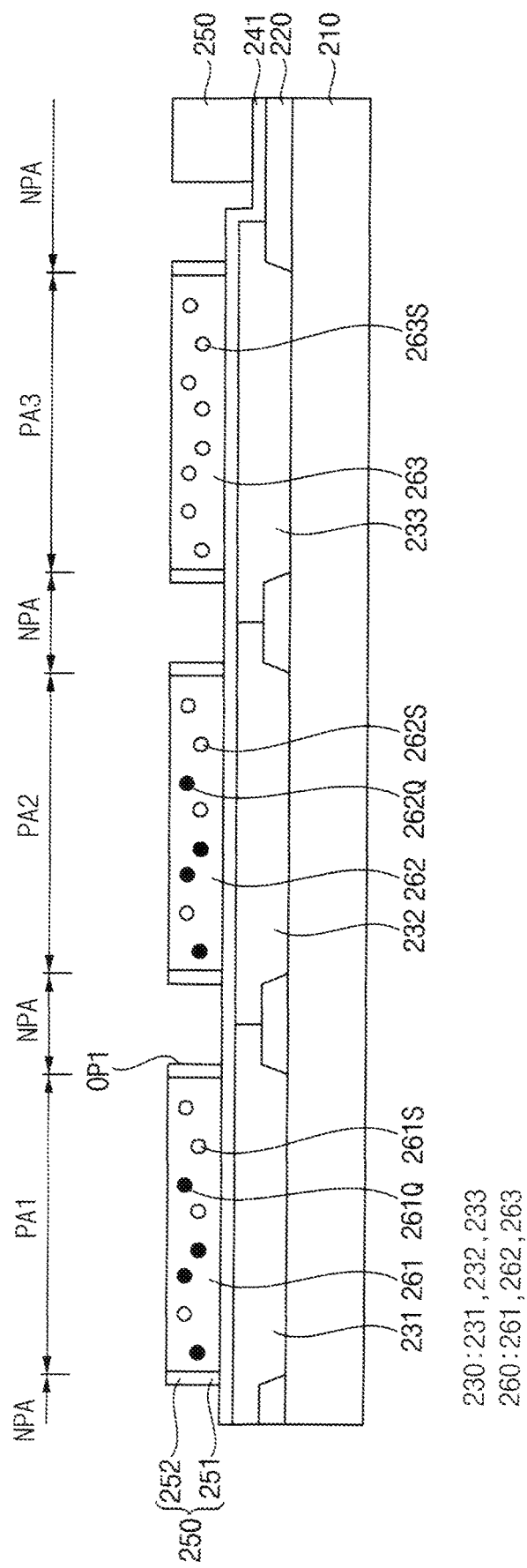

Referring to FIG. 5, the first color conversion pattern 261, the second color conversion pattern 262, and the light transmission pattern 263 may be formed on the first color filter 231, the second color filter 232, and the third color filter 233, respectively. In some embodiments, the first color conversion pattern 261, the second color conversion pattern 262, and the light transmission pattern 263 may be formed by injecting phosphors, quantum dots, scattering bodies, transparent polymer materials, and/or the like into a portion where the transmission bank 250 is not located on the first protective layer 241. Because the second portion 252 of the transmission bank 250 has liquid repellency with respect to the first color conversion pattern 261, the second color conversion pattern 262, and the light transmission pattern 263; the first color conversion pattern 261, the second color conversion pattern 262, and the light transmission pattern 263 may be formed in the first pixel area PA1, the second pixel area PA2, and the third pixel area PA3, respectively, and not in the non-pixel area NPA.

Figure 6:
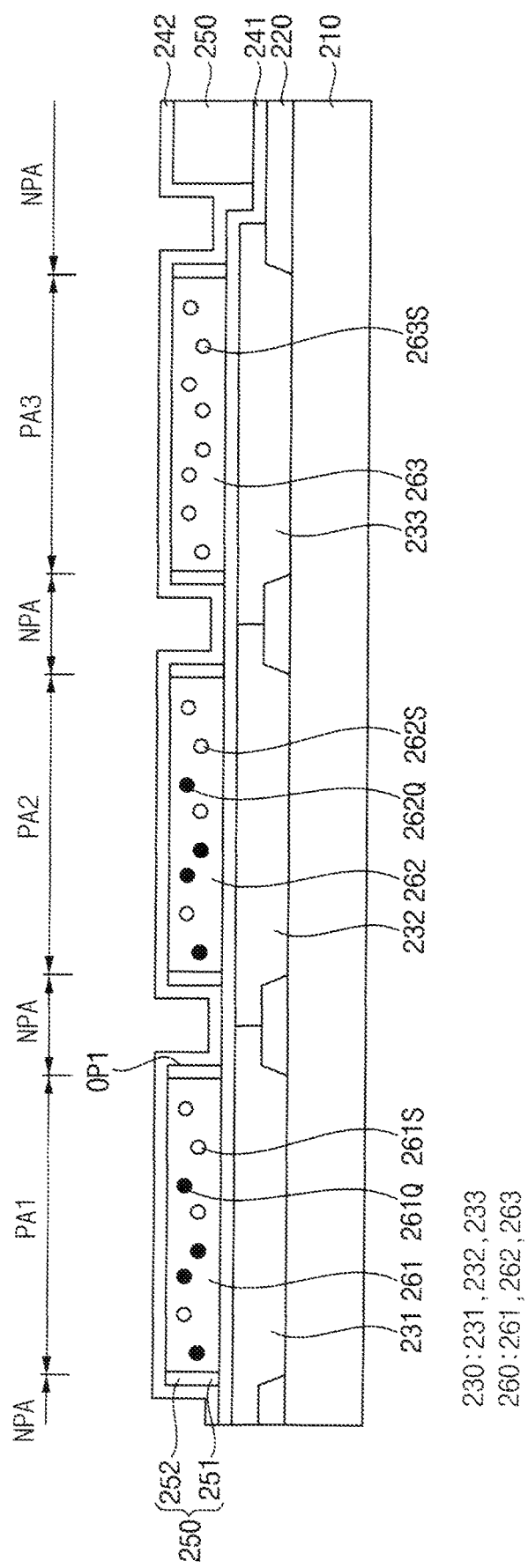

Referring to FIG. 6, the second protective layer 242 may be formed on the transmission bank 250, the first color conversion pattern 261, the second color conversion pattern 262, and the light transmission pattern 263. The second protective layer 242 may extend into the first opening OP1 of the transmission bank 250.

Figure 7:
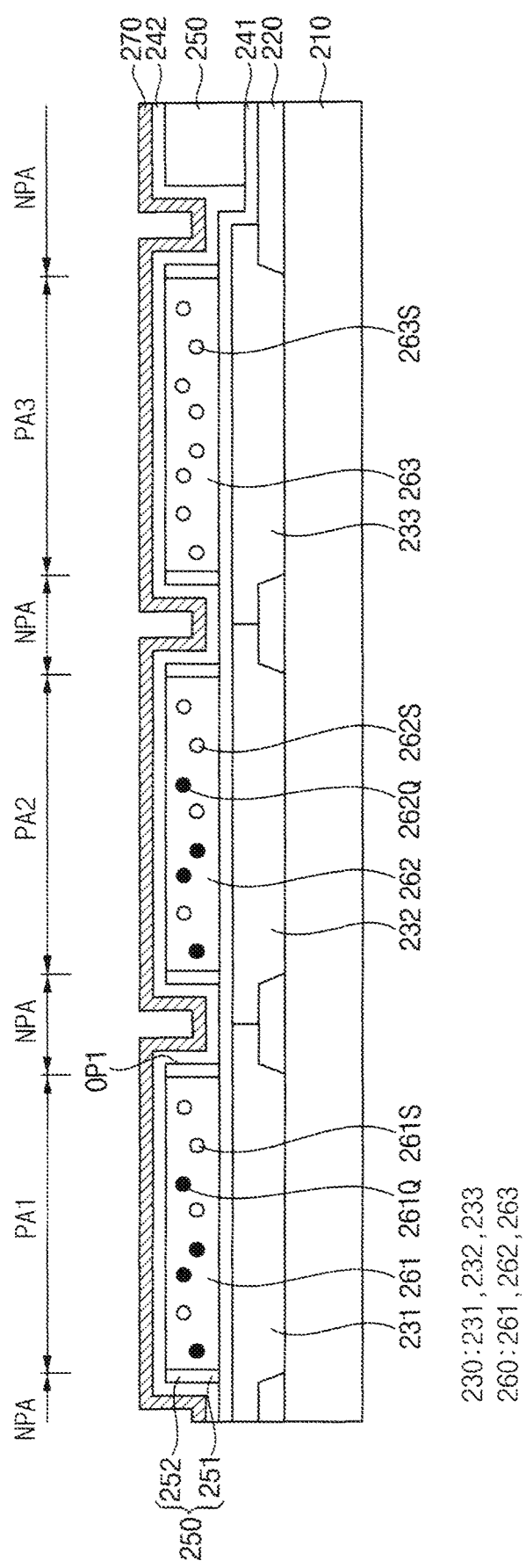

Referring to FIG. 7, a reflective layer 270 may be formed on the second protective layer 242. The reflective layer 270 may extend into the first opening OP1 of the transmission bank 250 along a profile of the second protective layer 242.

Figure 8:
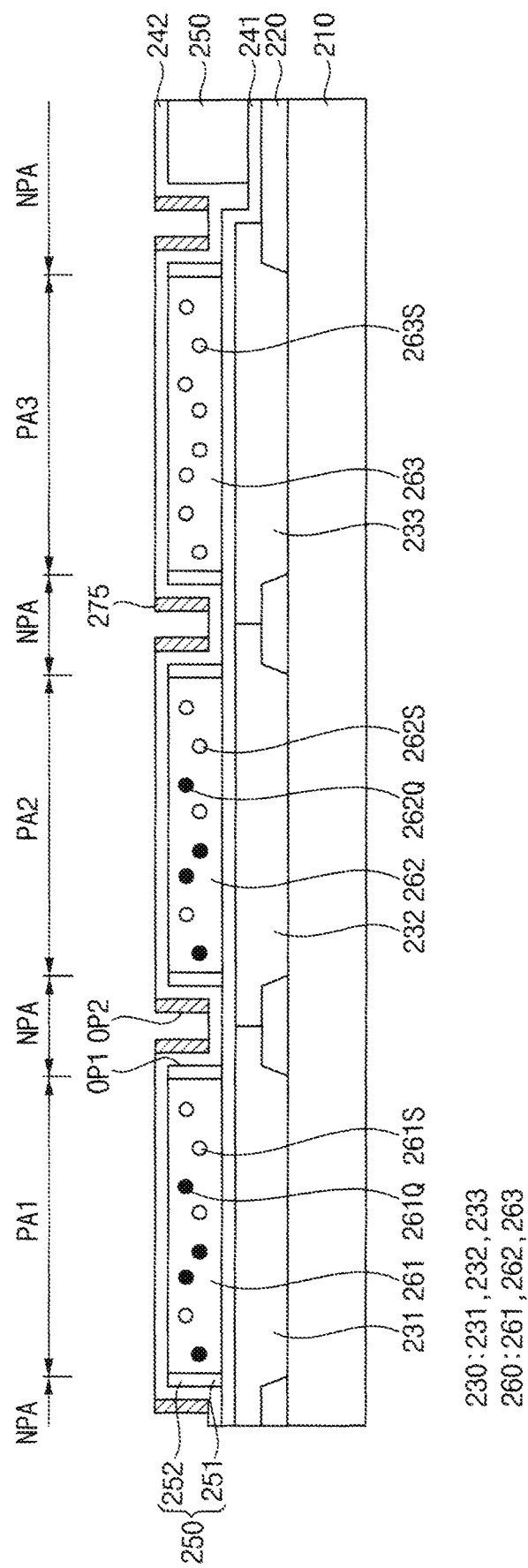

Referring to FIG. 8, a reflection bank 275 may be formed in the first opening OP1 of the transmission bank 250 by patterning the reflective layer 270.

In one or more embodiments, the reflective layer 270 may be patterned by dry etching. The reflective layer 270 may be patterned without a photolithography process using a mask. When the reflective layer 270 is patterned by the dry etching, the reflective layer 270 may be etched from a top surface of the reflective layer 270 by a thickness of the reflective layer 270. Accordingly, a part of the reflective layer 270 in the first pixel area PA1, the second pixel area PA2, and the third pixel area PA3 may be removed, and the second opening OP2 may have a shape of a through-hole formed in the reflection bank 275, and exposing the non-pixel area NPA of the second protective layer 242.

In methods of manufacturing the color conversion panel according to embodiments of the present disclosure, the reflective layer 270 may be patterned without a photolithography process using a mask. Accordingly, the manufacturing cost and time for producing the color conversion panel of present embodiments may be reduced.

Figure 9:
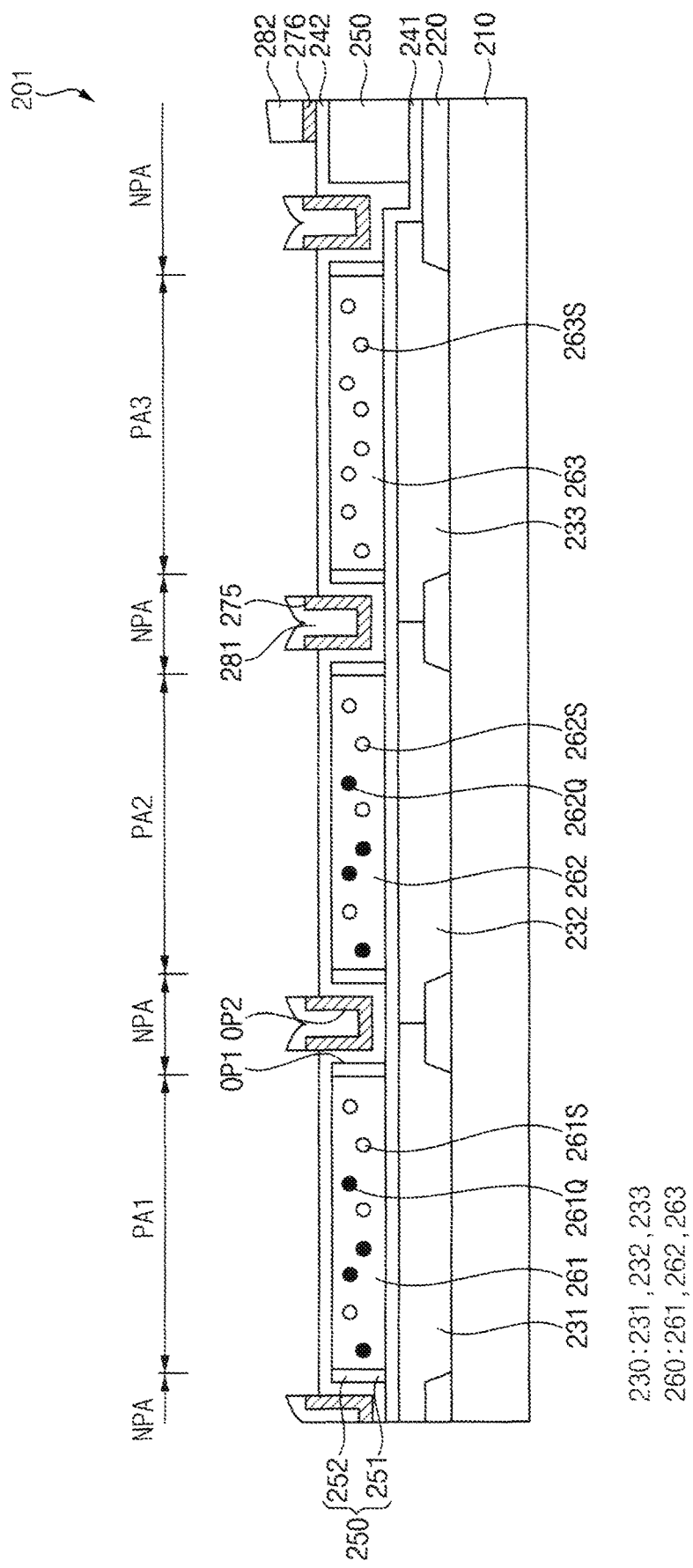
FIG. 9 is a cross-sectional view of a color conversion panel of embodiments of the present disclosure.

FIG. 9 is a cross-sectional view of a color conversion panel according to embodiments of the present disclosure.

Referring to FIG. 9, the color conversion panel 201 according to one embodiment may include a second substrate 210, a light blocking layer 220, a color filter layer 230, a first protective layer 241, a transmission bank 250, a color conversion layer 260, a second protective layer 242, a reflection bank 275, a filler 281, and a column spacer 282. The color conversion panel 201 described with reference to FIG. 9 may be substantially the same as or similar to the color conversion panel 200 described with reference to FIG. 3, except for a shape of the reflective bank 275 and an addition of the filler 281 and the column spacer 282. Accordingly, duplicative descriptions of configurations described elsewhere herein will not be repeated here.

In some embodiments, the second opening OP2 of the reflection bank 275 may have a shape of a recessed hole which is recessed toward the second substrate 210 from the top surface of the reflection bank 275. For example, the reflection bank 275 may have a 'U' shape when viewed in a cross-sectional view.

The filler 281 may be in the non-pixel area NPA on the reflection bank 275. The filler 281 may fill the second opening OP2 of the reflection bank 275. In one embodiment, the filler 281 may include photoresist.

The column spacer 282 may be in the non-pixel area NPA on the second protective layer 242. The column spacer 282 may be on a portion of the transmission bank 250 in which the first opening OP1 is not formed. The column spacer 282 may maintain a constant distance, or a substantially constant distance, between the display panel 100 and the color conversion panel 201 in the process of bonding the display panel 100 (FIG. 2) to the color conversion panel 201.

The column spacer 282 may be composed of the same, or substantially the same, material as the filler 281. In one embodiment, the column spacer 282 may include photoresist.

A conductive pattern 276 may be in between the second protective layer 242 and the column spacer 282. The conductive pattern 276 may be composed of the same, or substantially the same, material as the reflection bank 275.

Figure 10:
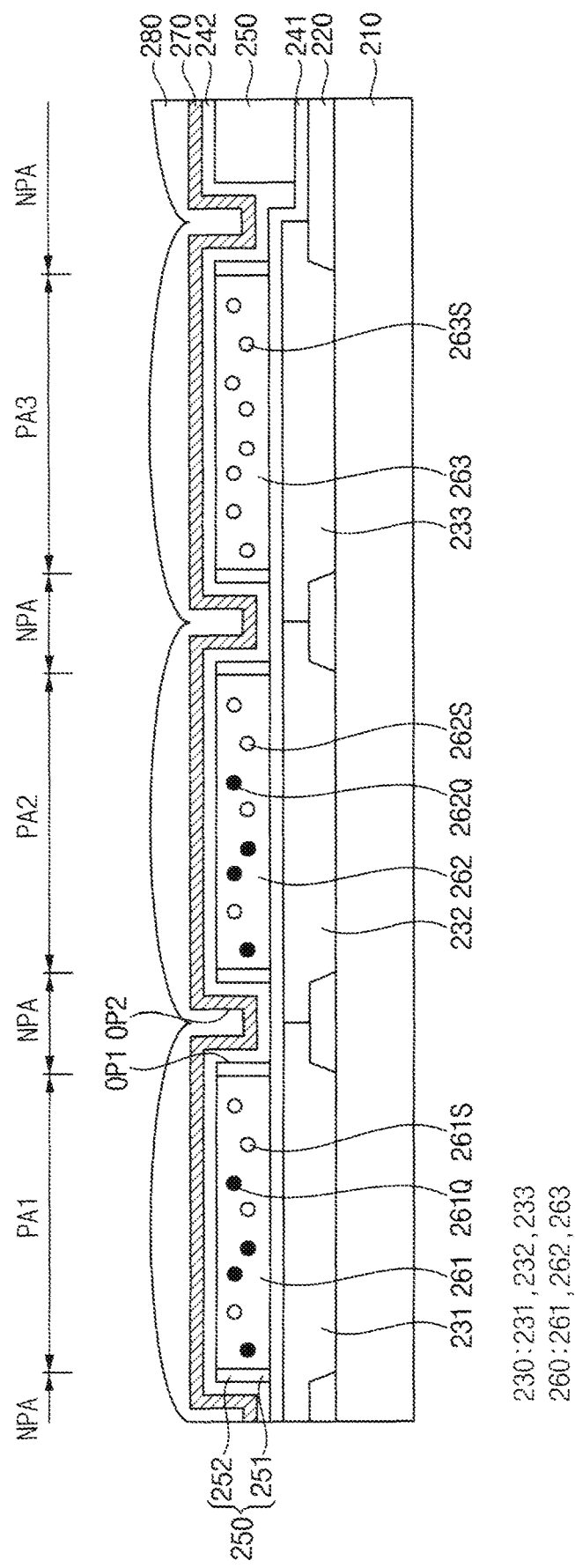
FIGS. 10 to 12 are cross-sectional views illustrating a method of manufacturing the color conversion panel according to embodiments of the present disclosure.
Figure 11:
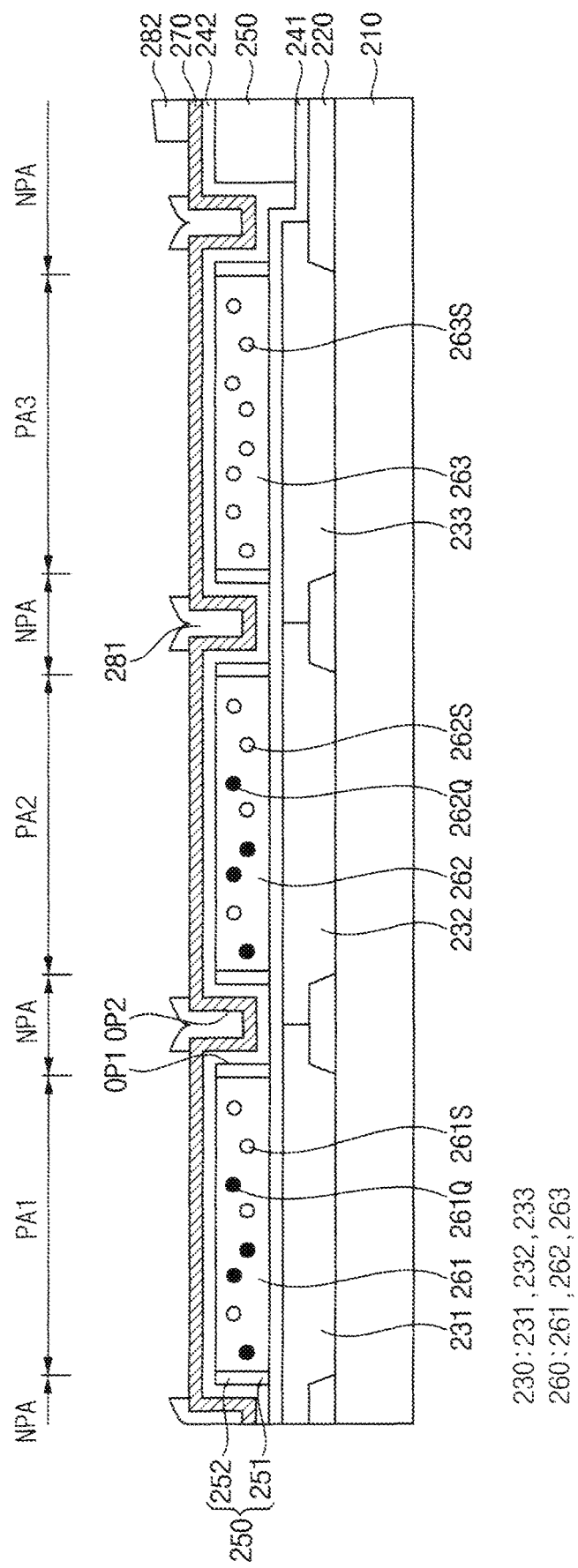
Figure 12:
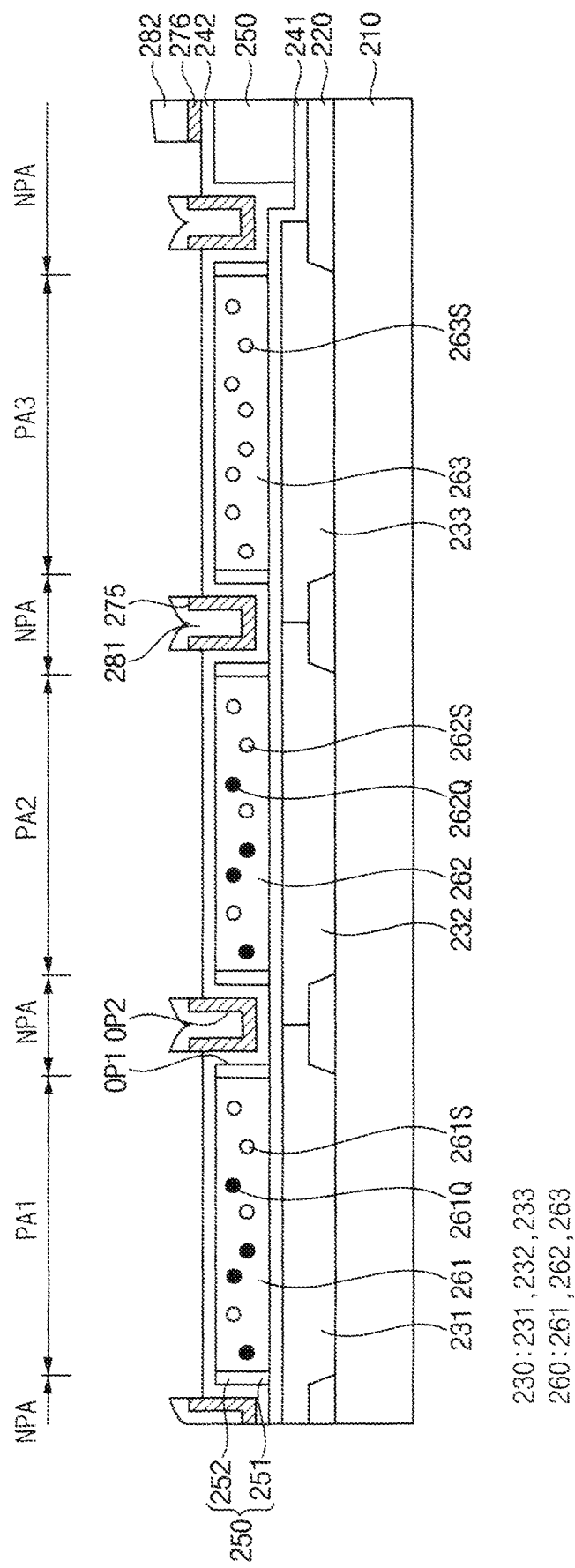

FIGS. 10 to 12 are cross-sectional views illustrating methods of manufacturing the color conversion panel according to embodiments of the present disclosure. For example, FIGS. 10 to 12 may represent a method of manufacturing the color conversion panel 201 of FIG. 9.

In the methods of manufacturing the color conversion panel described with reference to FIGS. 10 to 12, the description of configurations substantially the same as or similar to the methods of manufacturing the color conversion panel described with reference to FIGS. 4 to 8 will not be repeated here.

Referring to FIGS. 10 to 12, a reflection bank 275 may be formed in the first opening OP1 of the transmission bank 250 by patterning the reflective layer 270. In one embodiment, the reflective layer 270 may be patterned by wet etching.

First, as shown in FIG. 10, a photoresist layer 280 may be formed on the reflective layer 270. The photoresist layer 280 may be formed along a profile of the reflective layer 270. A height of a top surface of the photoresist layer 280 in the non-pixel area NPA may be lower than a height of a top surface of the photoresist layer 280 in the first pixel area PA1, the second pixel area PA2, and the third pixel area PA3.

Then, as shown in FIG. 11, the filler 281 and the column spacer 282 may be formed by patterning the photoresist layer 280. The filler 281 may overlap the first opening OP1 of the transmission bank 250, and the column spacer 282 may be positioned on the transmission bank 250. A height of a top surface of the column spacer 282 may be higher than a height of a top surface of the filler 281.

Then, as shown in FIG. 12, the reflection bank 275 may be formed by etching the reflective layer 270. The filler 281 and the column spacer 282 may be used as a mask to etch the reflective layer 270. A reflective pattern 276 overlapping the column spacer 282 may be formed under the column spacer 282.

In methods of manufacturing the color conversion panel according to embodiments of the present disclosure, the filler 281 and the column spacer 282 may be used as a mask to pattern the reflective layer 270. Accordingly, the reflective layer 270 may be patterned without an additional photolithography process. Accordingly, the manufacturing cost and time for production of the color conversion panel of present embodiments may be reduced.

The display device according to present embodiments may be applied to a display device included in a computer, a notebook, a mobile phone, a smartphone, a smart pad, a PMP, a PDA, an MP3 player, and/or any other device utilizing a display panel.

It will be apparent to those skilled in the art that various modifications and variations can be made to the subject matter of the present disclosure. Thus, it is intended that the present disclosure covers the modifications and variations of subject matter disclosed herein provided that they come within the scope of the appended claims and their equivalents.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the color conversion panels, the methods of manufacturing the color conversion panels, and the display devices of present embodiments have been described with reference to the drawings, the illustrated embodiments are examples, and may be modified and changed by a person having ordinary knowledge in the relevant technical field without departing from the technical spirit of the present disclosure as described in the following claims.

What is claimed is:

1. A color conversion panel including a first pixel area, a second pixel area, a third pixel area, and a non-pixel area positioned between the first pixel area, the second pixel area, and the third pixel area, the color conversion panel comprising:
    a substrate;
    a light blocking layer in the non-pixel area on the substrate;
    a color filter layer including a first color filter in the first pixel area on the substrate, a second color filter in the second pixel area on the substrate, and a third color filter in the third pixel area on the substrate;
    a color conversion layer including a first color conversion pattern on the first color filter, a second color conversion pattern on the second color filter, and a light transmission pattern on third color filter;
    a first bank between the first color conversion pattern, the second color conversion pattern, and the light transmission pattern; and
    a second bank in an opening of the first bank, wherein the first bank includes a first lyophilic portion, and a second liquid repellant portion positioned above the first lyophilic portion.

2. The color conversion panel of claim 1, wherein the first bank has a transmittance of about 10% or more.

3. The color conversion panel of claim 1, wherein the second bank comprises metal having a reflectance of 50% or more.

4. The color conversion panel of claim 3, wherein the second bank comprises at least one selected from the group consisting of aluminum (Al), silver (Ag), and gold (Au).

5. The color conversion panel of claim 1, wherein the second bank comprises scattering bodies.

6. The color conversion panel of claim 5, wherein the second bank includes at least one of zinc oxide (ZnO), silicon oxide (SiO2), and titanium oxide (TiO2).

7. The color conversion panel of claim 1, wherein the second bank comprises an opening.

8. The color conversion panel of claim 7, wherein the opening of the second bank is empty.

9. The color conversion panel of claim 7, further comprising:
a filler in the opening of the second bank.

10. The color conversion panel of claim 9, further comprising:
a column spacer on the first bank, wherein the column spacer is composed of the same material as the filler.

11. The color conversion panel of claim 1, further comprising:
a protective layer on the color conversion layer, the protective layer extending between the first bank and the second bank.

12. A display device comprising a first pixel area, a second pixel area, a third pixel area, and a non-pixel area positioned between the first pixel area, the second pixel area, and the third pixel area, the display device comprising:
a display panel; and
a color conversion panel on the display panel,
wherein:
the color conversion panel comprises:
a substrate;
a light blocking layer in the non-pixel area, on the substrate;
a color filter layer comprising a first color filter in the first pixel area on the substrate, a second color filter in the second pixel area on the substrate, and a third color filter in the third pixel area on the substrate;
a color conversion layer comprising a first color conversion pattern on the first color filter, a second color conversion pattern on the second color filter, and a light transmission pattern on the third color filter;
a first bank on the light blocking layer between the first color conversion pattern, the second color conversion pattern, and the light transmission pattern; and
a second bank in an opening of the first bank,
wherein the second bank comprises an opening.

13. The display device of claim 12, wherein the display panel comprises a light emitting device in the first pixel area, the second pixel area, and the third pixel area.

14. The display device of claim 12, further comprising:
a filling layer between the display panel and the color conversion panel.

* * * * *